United States Patent
Liang et al.

(10) Patent No.: US 10,304,945 B2
(45) Date of Patent: May 28, 2019

(54) HIGH-SPEED SEMICONDUCTOR DEVICE AND METHOD FOR FORMING THE SAME

(71) Applicant: Taiwan Semiconductor Manufacturing Co., Ltd., Hsinchu (TW)

(72) Inventors: Victor Chiang Liang, Hsinchu (TW); Chia-Chung Chen, Keelung (TW); Chi-Feng Huang, Zhubei (TW); Shu-Fang Fu, Xinpu Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/468,880

(22) Filed: Mar. 24, 2017

(65) Prior Publication Data
US 2018/0277662 A1    Sep. 27, 2018

(51) Int. Cl.
*H01L 29/08* (2006.01)
*H01L 29/66* (2006.01)
(Continued)

(52) U.S. Cl.
CPC .... *H01L 29/66795* (2013.01); *H01L 29/0847* (2013.01); *H01L 29/41775* (2013.01); *H01L 29/41791* (2013.01); *H01L 29/66545* (2013.01); *H01L 29/66636* (2013.01); *H01L 29/785* (2013.01)

(58) Field of Classification Search
CPC ........... H01L 29/66795; H01L 29/0847; H01L 29/41775; H01L 29/41791; H01L 29/66545; H01L 29/785; H01L 23/5226
See application file for complete search history.

(56) References Cited

U.S. PATENT DOCUMENTS 8,772,109 B2   7/2014   Colinge
8,785,285 B2   7/2014   Tsai et al.
(Continued)

OTHER PUBLICATIONS

Liu et al., "Design of a CMOS T/R Switch With High Power Capability: Using Asymmetric Transistors", IEEE Microwave and Wireless Components Letters, vol. 22, No. 12, Dec. 2012, pp. 645-647.
(Continued)

*Primary Examiner* — Mark W Tornow
(74) *Attorney, Agent, or Firm* — Birch, Stewart, Kolasch & Birch, LLP

(57) ABSTRACT

A method for forming a semiconductor device is provided. The method includes forming a gate structure over a fin structure. The method includes forming a hard mask layer over the gate structure. The hard mask layer has a first opening spaced apart from a first side of the gate structure by a first distance and a second opening spaced apart from a second side of the gate structure by a second distance that is different from the first distance. The method also includes removing the fin structure not covered by the hard mask layer. The method further includes forming a first source/drain feature in the fin structure and filling the first opening of the hard mask layer. The method further includes forming a second source/drain feature in the fin structure and filling the second opening of the hard mask layer.

20 Claims, 13 Drawing Sheets

(51) Int. Cl.
*H01L 29/78* (2006.01)
*H01L 29/417* (2006.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,076,869 B1 * | 7/2015 | Hu ..................... H01L 29/7848 |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,859,386 B2 * | 1/2018 | Ho .................... H01L 29/41783 |
| 2013/0214357 A1 * | 8/2013 | Chang ............... H01L 29/66545 |
| | | 257/347 |
| 2015/0311342 A1 * | 10/2015 | Lin .................... H01L 29/7848 |
| | | 257/190 |
| 2016/0141423 A1 * | 5/2016 | Diaz ................ H01L 29/78618 |
| | | 257/329 |
| 2016/0260669 A1 * | 9/2016 | Paak .................... H01L 23/535 |

OTHER PUBLICATIONS

Omura, "Phenomenalistic Reconsideration of Hooge Parameter in Buried-Channel Metal-Oxide-Semiconductor Field-Effect Transistors", 2001 IEEE International SOI Conference, 2001, pp. 51-52.

* cited by examiner

HIGH-SPEED SEMICONDUCTOR DEVICE AND METHOD FOR FORMING THE SAME

CROSS REFERENCE TO RELATED APPLICATIONS

This application is related to the following co-pending a commonly assigned patent application: U.S. Ser. No. 15/255,370, filed on Sep. 2, 2016, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Radio frequency (RF) circuits, such as voltage controlled oscillators ("VCOs"), low noise amplifiers ("LNAs"), and phase locked loops ("PLLs"), are widely used in wireless communication systems. Various RF circuits that operate at high frequencies, for example, in gigahertz (GHz) frequency ranges, are integrated with other devices to form a system. In some instances, the RF circuit is applied in a microwave or millimeter-wave (mmW) apparatus, which usually refers to a device capable of transmitting signals at a frequency of approximately 10 GHz to 300 GHz. However, there are many challenges related to RF circuits.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
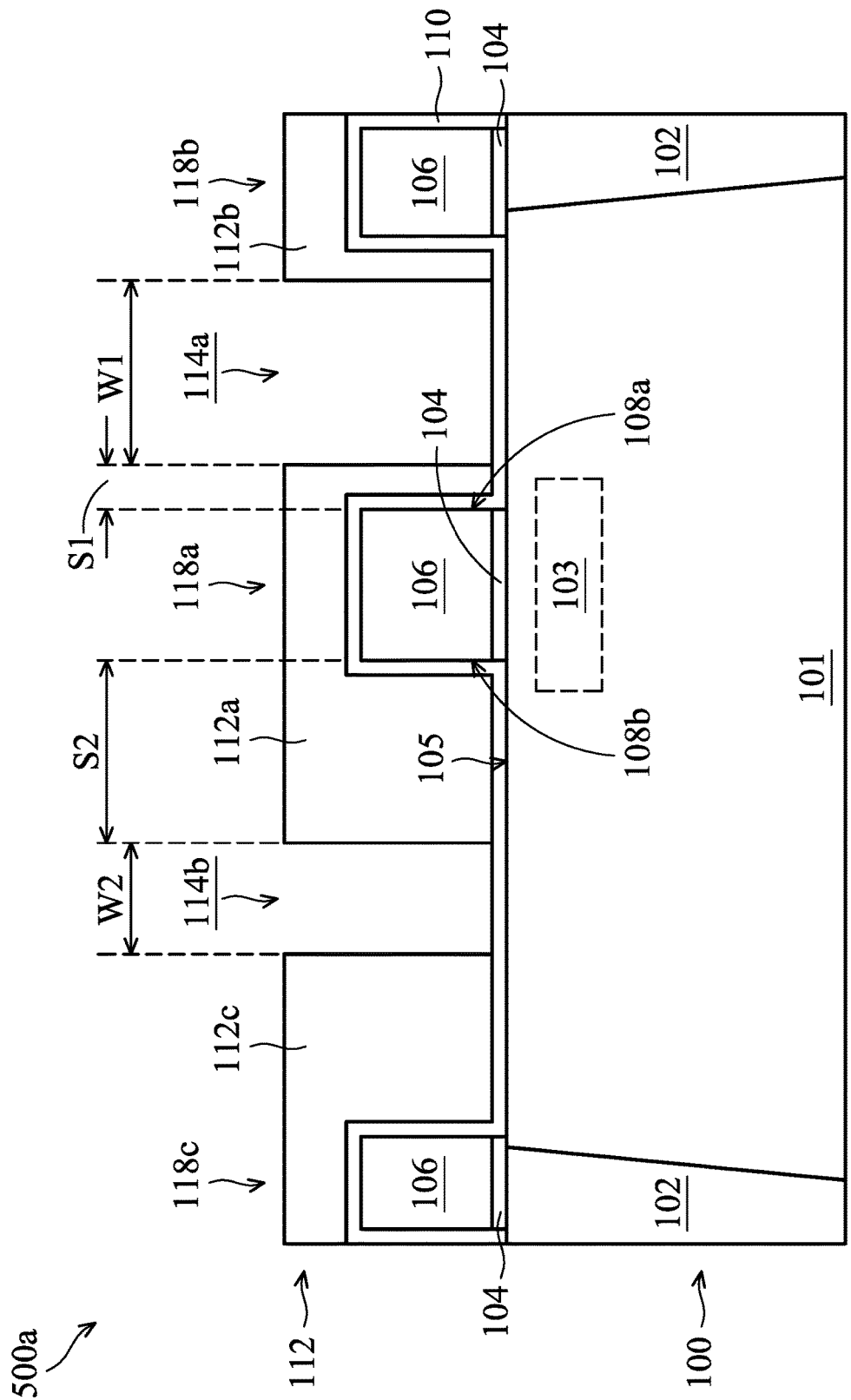
FIGS. 1A-1J are cross-sectional views of various stages of a process for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Advances in complimentary metal-oxide-semiconductor (CMOS) technology have allowed for reduction in device feature sizes, increases in high integrated circuit (IC) densities, and an implementation of devices with high processing speeds of applications in a GHz range. However, with smaller process geometries, some parasitic capacitances such as gate-to-contact capacitance (Cco), gate-to-source/drain fringe capacitance (Cf), and even gate-to-metal capacitance have become increasingly important. CMOS devices have become more sensitive to the layout environment and have a significant impact to a circuit performance. For example, due to the Miller effect and the formation of wiring slot contacts of local interconnects, the magnitude of Cco increases by at least two times compared to previous technology, in some instances, accounting for an increasing proportion of time delay and resulting in degradation of the circuit speed. The mismatched performance of such large parasitic capacitance impacts the accuracy of the resulting signal. Reducing parasitic capacitance helps CMOS devices to function within operating parameters and tolerances.

In RF applications, parasitic capacitance causes various types of detrimental effects to an IC, such as undesired time delays. Thus, reducing the impact of parasitic capacitance on the performance of the IC helps to maintain a high density of interconnects with less delay variation in the circuit performance. In some approaches, by shrinking the gate structure, a magnitude of conductance is increased, thereby decreasing time delay. In some embodiments, a channel region is doped to be displaced away from surfaces of a fin to reduce imperfections at the surfaces, which minimizes undesired noise. In some embodiments, by extending the distance between a gate structure and at least one of the source/drain features, a magnitude of Cf, Cco and Cm are reduced, resulting in a shorter signal delay in comparison with devices without the extended distance. In some embodiments, at least one of the source/drain features is kept in a minimum design rule so that the area of the asymmetric arrangement is kept as small as possible to reduce the overall size of the designed IC.

Embodiments of a semiconductor device and a method for forming the same are provided. FIGS. 1A-1J are cross-sectional views of various stages of a process for forming a semiconductor device 500a, in accordance with some embodiments. As shown in FIG. 1A, a substrate (not shown) including a semiconductor fin structure 100 is received. In some embodiments, the semiconductor fin structure 100 is a part of a fin field effect transistor (FinFET). The semiconductor fin structure 100 extends above the substrate. In some embodiments, the substrate and the semiconductor fin structure 100 are made of the same material. For example, the substrate is a silicon substrate. In some instances, the substrate includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the substrate is a silicon on insulator (SOI) layer substrate or a silicon on sapphire (SOS) substrate. In some embodiments, the substrate and the semiconductor fin structure 100 are made of different materials. In some embodiments, the substrate is free of the semiconductor fin structure 100, and thereby each component is formed on a planar top surface of the substrate. The semiconductor fin structure 100 may be surrounded by isolating features 102, which are also called insulating features. The isolating features 102 may electrically isolate an active region (not shown) of the semiconductor device 100 from other active regions. In some embodiments, the isolating features 102 are shallow trench isolation (STI), field oxide (FOX), or another suitable electrically insulating structure. In some embodiments, the formation of the isolating regions 102 includes a photolithography process, an etching process to form trenches (not shown) in the semiconductor fin structure 100 or the substrate, and a deposition process to fill the trenches with one or more dielectric materials. In some embodiments, the formation of the isolating features 102 includes another STI procedure or local oxidation of silicon (LOCOS).

In some embodiments, a capping oxide layer (not shown) is formed over the semiconductor fin structure 100. In some embodiments, the formation of the capping oxide layer includes a thermal oxidation process. In some embodiments, the formation of the capping oxide layer includes a deposition process. A well region 101 is formed in the semiconductor fin structure 100. In some embodiments, the well region 101 extends into the substrate which is below the isolating features 102. The well region 101 may be separated from another well region of an adjacent semiconductor device by the isolating features 102. For an n-type transistor, the well region 101 is a p-well region with a p-type dopant such as boron, indium, or another suitable acceptor dopant. For a p-type transistor, the well region 101 is an n-well region with an n-type dopant such as phosphorous, arsenic, antimony, or another suitable donor dopant. In some embodiments, the formation of the well region 101 includes an implantation process. In some embodiments, an annealing process is performed following the implantation process.

As shown in FIG. 1A, in some embodiments, a buried channel region 103 is formed in the semiconductor fin structure 100 by an inhomogeneous implantation process. For the n-type transistor, the buried channel region 103 is doped with a p-type dopant, such as boron, indium, or another suitable acceptor dopant. For the p-type transistor, the buried channel region 103 is doped with an n-type dopant, such as phosphorus, arsenic, or another suitable donor dopant. A buried channel region 103 may be formed below a subsequent dummy gate structure 118a and between a subsequent first source/drain feature and a second source/drain feature. In some embodiments, a center portion of the buried channel region 103 has a higher dopant concentration than end portions of the buried channel region 103. The dopant concentration of the buried channel region 103 may have a Gaussian distribution along a direction perpendicular to the longitudinal axis of the semiconductor fin structure 100. In some embodiments, the highest dopant concentration of the buried channel region 103 is in a portion of the buried channel region 103 below the subsequent dummy gate structure 118a. In some embodiments, the highest concentration of the buried channel region 103 is in a range from about $1.7E18$ $cm^{-3}$ to about $2.0E20$ $cm^{-3}$. The buried channel region 103 may be formed in the interior of the semiconductor fin structure 100 away from surfaces of the semiconductor fin structure 100. In some embodiments, the buried channel region 103 includes silicon germanium or III-V semiconductor materials. In some embodiments, the formation of the buried channel region 103 includes a photolithography process, an implantation process and an annealing process.

After the buried channel region 103 is formed, a dummy gate structure 118a is formed over the semiconductor fin structure 100. In addition, dummy gate structures 118b and 118c are formed over the isolating features 102, as shown in FIG. 1A in accordance with some embodiments. The dummy gate structure 118a is formed on the semiconductor fin structure 100 and between the dummy gate structures 118b and 118c. The dummy gate structures 118b and 118c are partially on the semiconductor fin structure 100 and partially on the isolating features 102. In some embodiments, each of the dummy gate structures 118a, 118b and 118c include a gate dielectric 104 and a gate electrode 106 formed over the gate dielectric 104.

In some embodiments, the gate dielectric 104 is silicon dioxide. In some embodiments, the silicon dioxide is a thermally grown oxide. In some embodiments, the gate dielectric is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode 106 includes polycrystalline-silicon (poly-Si), poly-crystalline silicon-germanium (poly-SiGe), metallic nitride, metallic silicide, metallic oxide, metal, and other suitable layers. In some embodiments, the gate electrode 106 is made of, for example, polysilicon.

In some embodiments, the formation of the gate dielectric 104 and the gate electrode 106 includes a deposition process and a subsequent patterning process. The deposition process is performed to deposit a gate dielectric material layer and a gate electrode material layer (not shown) in sequence. The patterning process is then performed to partially remove the gate dielectric material layer and the gate electrode material layer to form the gate dielectric 104 and the gate electrode 106 of each of the dummy gate structures 118a, 118b and 118c. In some embodiments, the deposition process includes a chemical vapor deposition (CVD) process, a physical vapor deposition (PVD) process, an atomic layer deposition (ALD) process, a thermal oxidation process, or another applicable process. In some embodiments, the patterning process includes a photolithography process and a subsequent etching process. In some embodiments, the etching process is a dry etching process.

After the gate dielectric 104 and the gate electrode 106 of each of the dummy gate structures 118a, 118b and 118c are formed, a hard mask layer 110 is entirely formed over the semiconductor fin structure 100 and the dummy gate structures 118a, 118b and 118c, as shown in FIG. 1A in accordance with some embodiments. In addition, the hard mask layer 110 is conformally formed over the dummy gate structures 118a, 118b and 118c. In some embodiments, the hard mask layer 110 is made of silicon nitride, silicon oxynitride, silicon carbide, another suitable material, or a combination thereof. The hard mask layer 110 may be deposited using a chemical vapor deposition (CVD) process, a physical vapor deposition (PVD) process, a spin-on process, another applicable process, or a combination thereof.

After the hard mask layer 110 is formed, lightly doped regions (not shown) are formed at opposite sides of each of the dummy gate structures 118a, 118b and 118c, in accordance with some embodiments. The lightly doped regions may serve as lightly doped source or lightly doped drain (LDS/LDD) regions of the semiconductor device. Short channel effects may be mitigated by the lightly doped regions. In some embodiments, the lightly doped regions (not shown) are formed by a light ion implantation process and a subsequent annealing process using the dummy gate structures 118a, 118b and 118c as an implantation mask.

After the lightly doped regions (not shown) are formed, a mask pattern layer 112 is formed over the hard mask layer 110, as shown in FIG. 1A in accordance with some embodiments. In some embodiments, the mask pattern layer 112 including mask patterns 112a, 112b and 112c is patterned by a photolithography process to form openings 114a and 114b through the mask pattern layer 112. In some embodiments, the mask patterns 112a, 112b and 112c are formed covering the dummy gate structures 118a, 118b and 118c, respectively. In addition, the mask pattern 112a covers top and sidewalls of the dummy gate structure 118a and extends to cover a portion of the semiconductor fin structure 100 outside the dummy gate structure 118a. The mask patterns 112b covers a top and sidewalls of the dummy gate structure 118b and extends to cover a portion of the semiconductor fin structure 100 outside the dummy gate structure 118b. The mask patterns 112c covers a top and sidewalls of the dummy gate structure 118c and extends to cover a portion of the semiconductor fin structure 100 outside the dummy gate structure 118c. In some embodiments, the opening 114a and the opening 114b are respectively positioned at a first side 108a and a second side 108b of the dummy gate structure 118a. In addition, the first side 108a is opposite to the second side 108b of the dummy gate structure 118a. In some embodiments, the opening 114a of the mask pattern layer 112 is positioned between the dummy gate structure 118a and the dummy gate structure 118b, the opening 114b of the mask pattern layer 112 is positioned between the dummy gate structure 118a and the dummy gate structure 118c. The opening 114a of the mask pattern layer 112 may be spaced apart from the first side 108a of the dummy gate structure 118a by a first distance S1. Furthermore, the opening 114b of the mask pattern layer 112 may be spaced apart from the second side 108b of the dummy gate structure 118a by a second distance S2 that is different from the first distance S1. In some embodiments, the first distance S1 is less than or greater than the second distance S2. In some embodiments, the opening 114a of the mask pattern layer 112 has a first width W1, and the opening 114b of the mask pattern layer 112 has a second width W2 that is different from or equal to the first width W1. In some embodiments, the first width W1 is less than or greater than the second width W2.

In some embodiments, the mask patterns 112a, 112b and 112c of the mask pattern layer 112 are formed of photoresist. The mask patterns 112a, 112b and 112c of the mask pattern layer 112 may be formed by a photolithography process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

Figure 1B:
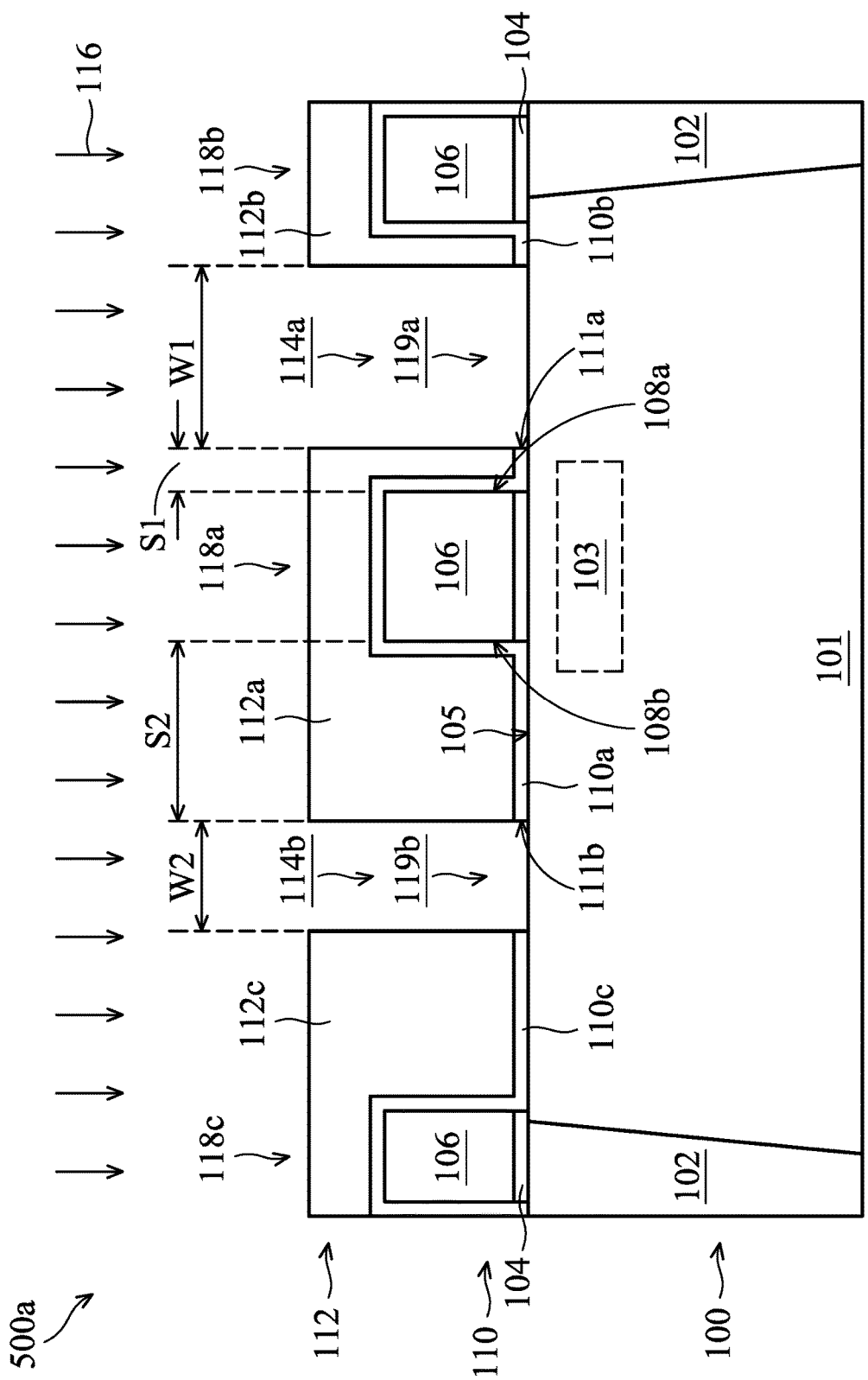

After the mask patterns 112a, 112b and 112c of the mask pattern layer 112 are formed, an etching process 116 is performed to form hard mask patterns 110a, 110b and 110c, as shown in FIG. 1B in accordance with some embodiments. During the etching process 116, portions of the hard mask layer 110 (shown in FIG. 1A) are etched through the openings 114a and 114b of the mask pattern layer 112 to form openings 119a and 119b through the hard mask layer 110. In addition, the etching process 116 may stop when the semiconductor fin structure 100 is exposed. After performing the etching process 116, the hard mask layer 110 not covered by the mask patterns 112a, 112b and 112c is removed to form the hard mask patterns 110a, 110b and 110c. In addition, portions of the semiconductor fin structure 100 are exposed to the openings 114a and 114b of the mask pattern layer 112.

In some embodiments, the opening 119a and the opening 119b of the hard mask layer 110 are positioned overlapping the opening 114a and the opening 114b of the mask pattern layer 112, respectively. Therefore, the opening 119a of the hard mask layer 110 may be spaced apart from the first side 108a of the dummy gate structure 118a by the first distance S1. Furthermore, the opening 119b of the hard mask layer 110 may be spaced apart from the second side 108b of the dummy gate structure 118a by the second distance S2 that is different from the first distance S1. In addition, the hard mask pattern 110a covers the top and the sidewalls of the dummy gate structure 118a and extends to cover a portion of the semiconductor fin structure 100 outside the dummy gate structure 118a. The hard mask pattern 110b covers the top and the sidewalls of the dummy gate structure 118b and extends to cover a portion of the semiconductor fin structure 100 outside the dummy gate structure 118b. The hard mask pattern 110c covers the top and the sidewalls of the dummy gate structure 118c and extends to cover a portion of the semiconductor fin structure 100 outside the dummy gate structure 118c.

In some embodiments, the hard mask pattern 110a has a first edge 111a and a second edge 111b respectively on the first side 108a and the second side 108b of the dummy gate structure 118a. In some embodiments, the first edge 111a of the hard mask pattern 110a is spaced apart from the first side 108a of the dummy gate structure 118a by a first distance S1, the second edge 111b is spaced apart from the second side 108b of the dummy gate structure 118a by a second distance S2 that is different from the first distance S1. In some embodiments, the first distance S1 is less than or greater than the second distance S2.

In some embodiments, the opening 119a of the hard mask layer 110 may have a first width W1, and the opening 119b of the hard mask layer 110 may have a second width W2 that is different from or equal to the first width W1. In some embodiments, the first width W1 is less than or greater than the second width W2. In some embodiments, the etching process 116 is a dry etching process or a wet etching process.

Figure 1C:
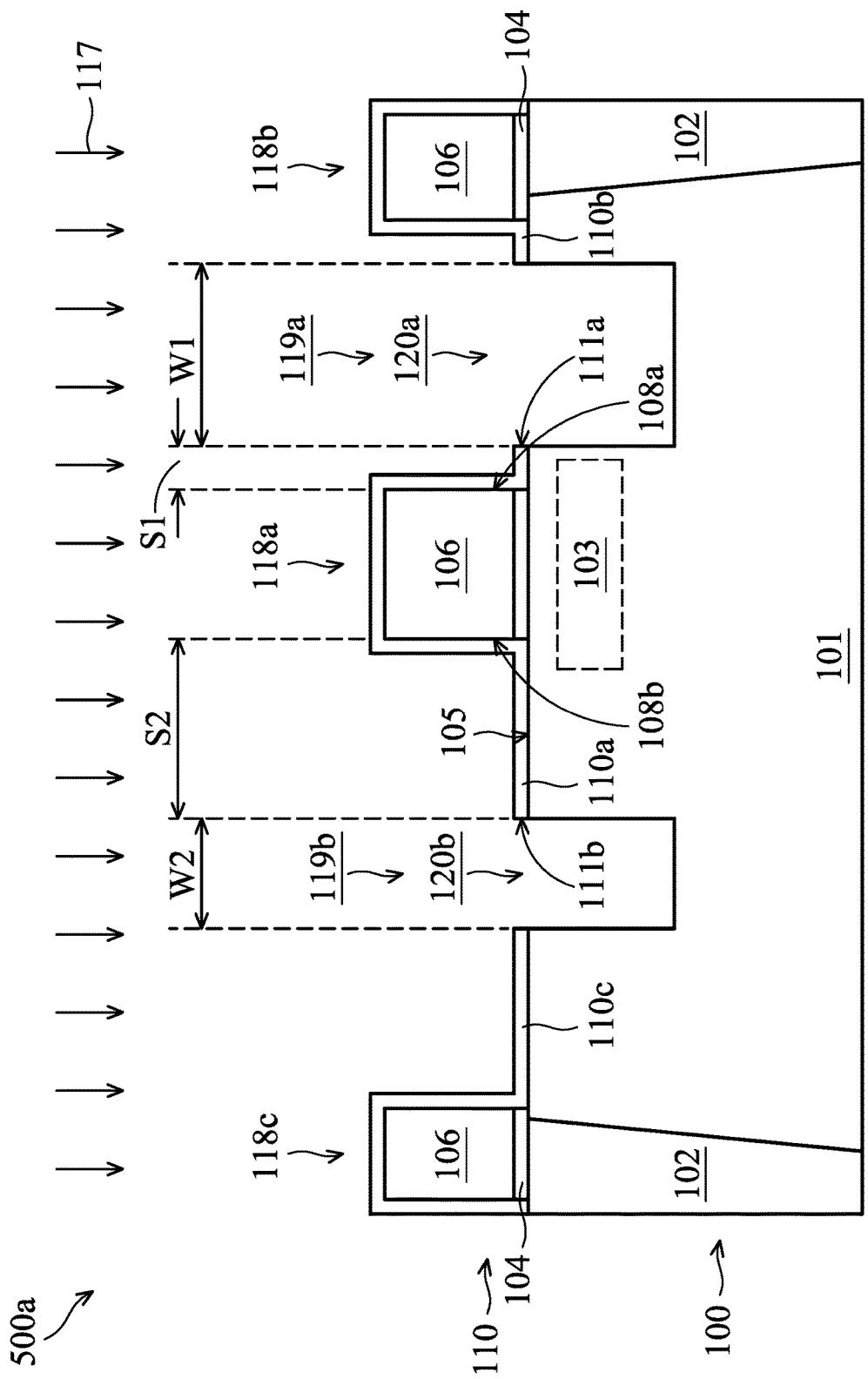

After the hard mask patterns 110a, 110b and 110c are formed, an etching process 117 is performed to form recesses 120a and 120b in the semiconductor fin structure 100, as shown in FIG. 1C in accordance with some embodiments. The recesses 120a and 120b are configured to provide positions of a source/drain features formed in the subsequent processes. During the etching process 117, a first portion of the semiconductor fin structure 100 exposed to the opening 119a of the hard mask layer 110 and a second portion of the semiconductor fin structure 100 exposed to the opening 119b of the hard mask layer 110 are removed. In other words, upper portions of the semiconductor fin structure 100 not covered by the hard mask patterns 110a, 110b and 110c are removed through openings 119a and 119b of the hard mask layer 110 to form the recesses 120a and 120b. In some embodiments, bottom surfaces of the recesses 120a and 120b are lower than top surfaces of the isolating features 102.

In some embodiments, the recesses 120a and 120b are aligned with the opening 119a and the opening 119b of the hard mask layer 110, respectively. Therefore, the recess 120a may be spaced apart from the first side 108a of the dummy gate structure 118a by the first distance S1. Furthermore, the recess 120b may be spaced apart from the second side 108b of the dummy gate structure 118a by the second distance S2 that is different from the first distance S1. In some embodiments, the first distance S1 is less than or greater than the second distance S2. Furthermore, the recess 120a may have a first width W1, and the recess 120b may have a second width W2 that is different from the first width W1. In some embodiments, the first width W1 is different from or equal to the second width W2.

In some embodiments, some of the lightly doped regions (not shown) that are not covered by the hard mask patterns 110a, 110b and 110c are removed during the etching process 117. In some embodiments, some of the lightly doped regions (not shown) which are directly below the dummy gate structure 118a are left. In some embodiments, the etching process 117 is a dry etching process or a wet etching process. After the etching process 117 is performed, the mask patterns 112a, 112b and 112c (shown in FIG. 1B) are removed.

Figure 1D:
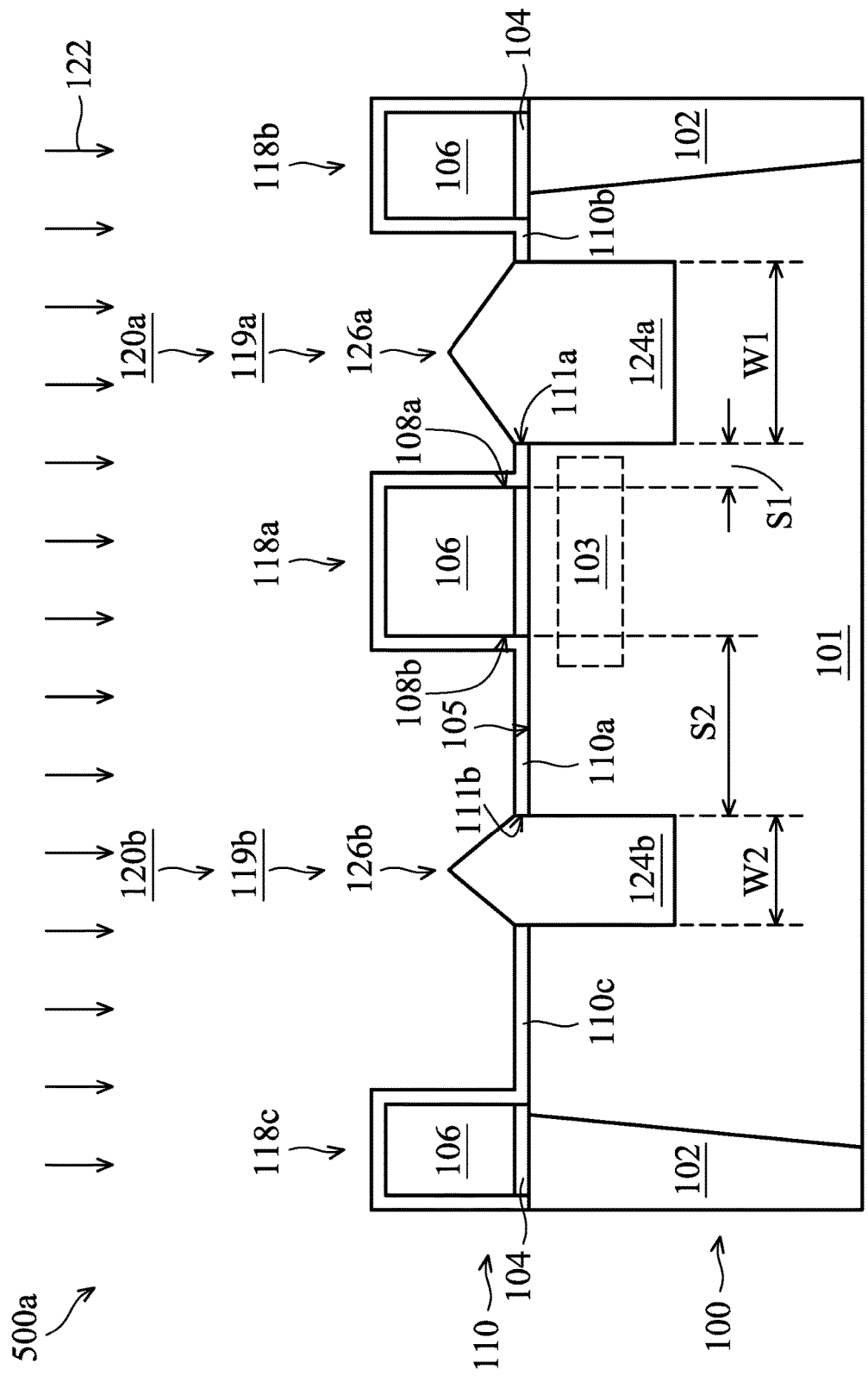

After the recesses 120a and 120b are formed, a filling process 122 is performed to form a first source/drain feature 124a and a second source/drain feature 124b in the recesses 120a and 120b, respectively, as shown in FIG. 1D in accordance with some embodiments. In some embodiments, the filling process 122 is performed by filling the recesses 120a and 120b with one or more strained semiconductor materials to form the first source/drain feature 124a and the second source/drain feature 124b. In addition, the first source/drain feature 124a and the second source/drain feature 124b are formed filling the opening 119a and the opening 119b of the hard mask layer 110.

In some embodiments, the first source/drain feature 124a and the second source/drain feature 124b are formed adjacent to or next to the lightly doped regions (not shown) close to the dummy gate structure 118a. The first source/drain feature 124a and the second source/drain feature 124b are respectively formed on the first side 108a and the second side 108b of the dummy gate structure 118a. The first source/drain feature 124a may be spaced apart from the first side 108a of the dummy gate structure 118a by the first distance S1. Furthermore, the second source/drain feature 124b may be spaced apart from the second side 108b of the dummy gate structure 118a by the second distance S2 that is different from the first distance S1. In other words, the dummy gate structure 118a may offset to a central point of the semiconductor fin structure 100 between the first source/drain feature 124a and the second source/drain feature 124b. Furthermore, the first source/drain feature 124a may have the first width W1, and the second source/drain feature 124b may have the second width W2 that is different from or equal to the first width W1. In some embodiments, the first source/drain feature 124a is a source feature and the second source/drain feature 124b is a drain feature of the semiconductor device 500a. In some embodiments, the first source/drain feature 124a is a drain feature and the second source/drain feature 124b is a source feature of the semiconductor device 500a.

In some embodiments, when the first source/drain feature 124a is a source feature and the second source/drain feature 124b is a drain feature of the semiconductor device 500a, the first width W1 is greater than or equal to the second width W2. In addition, the first distance S1 between the first source/drain feature 124a and the dummy gate structure 118a is less than the second distance S2 between the second source/drain feature 124b and the dummy gate structure 118a.

In some embodiments, a top 126a of the first source/drain feature 124a and a top 126b of the second source/drain feature 124b are higher than a top surface 105 of the semiconductor fin structure 100.

In some embodiments, the first source/drain feature 124a and the second source/drain feature 124b are formed of Ge, SiGe, InAs, InGaAs, InSb, GaAs, GaSb, InAlP, InP, or the like. In some embodiments, the lattice constant of the first source/drain feature 124a and the second source/drain feature 124b are different from the lattice constant of the semiconductor fin structure 100. In some embodiments, the first source/drain feature 124a and the second source/drain feature 124b have a diamond shape. In some embodiments, the filling process 122 includes an epitaxial process, such as a selective epitaxial growth (SEG) process, CVD deposition techniques (e.g., vapor-phase epitaxy (VPE) and/or ultra-high vacuum CVD (UHV-CVD)), molecular beam epitaxy, or another suitable epi process.

Figure 1E:
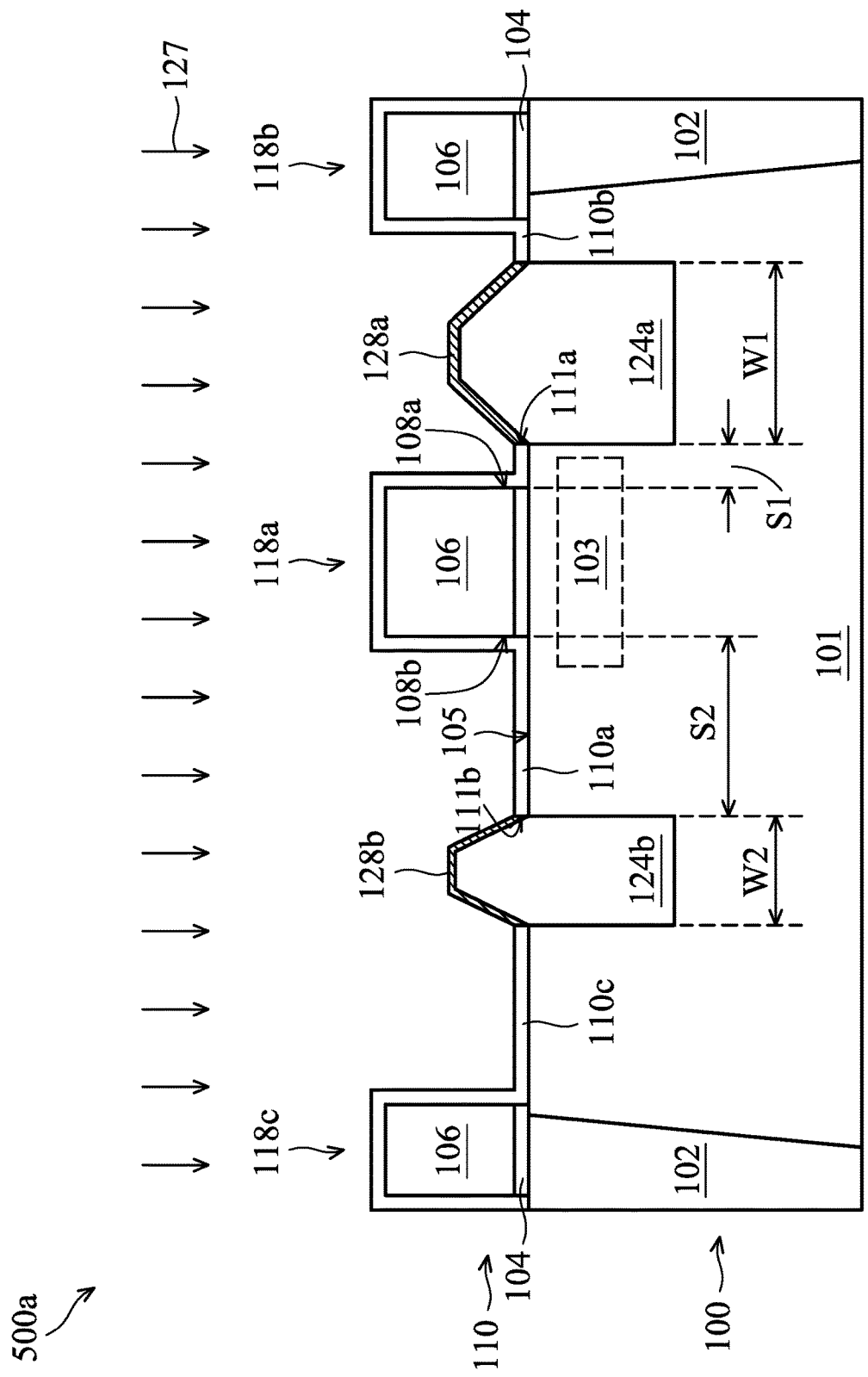

After the first source/drain feature 124a and the second source/drain feature 124b are formed, a silicidation process 127 is performed to form silicide layers 128a and 128b, as shown in FIG. 1E in accordance with some embodiments. In some embodiments, the silicide layers 128a and 128b are respectively formed on the first source/drain feature 124a and the second source/drain feature 124b. In some embodiments, the silicidation process 127 includes an etching-back process, a deposition process and an anneal process performed in sequence. The etching-back process is performed to remove upper portions of the first source/drain feature 124a and the second source/drain feature 124b from the top 126a of the first source/drain feature 124a and the top 126b of the second source/drain feature 124b (shown in FIG. 1D). The deposition process is then performed to deposit a metal material (not shown) over the first source/drain feature 124a and the second source/drain feature 124b. After performing the deposition process, the annealing process is performed to facilitate a reaction between the metal material and the upper portions of the first source/drain feature 124a and the second source/drain feature 124b under the metal material, thereby forming the silicide layers 128a and 128b on the first source/drain feature 124a and the second source/drain feature 124b.

In some embodiments, the silicide layers 128a and 128b are formed of one or more of cobalt silicide (e.g., CoSi, $CoSi_2$, $Co_2Si$, $Co_2Si$, $Co_3Si$; collectively "Co silicide"), titanium silicide (e.g., $Ti_5Si_3$, TiSi, $TiSi_2$, $TiSi_3$, $Ti_6Si_4$; collectively "Ti silicide"), nickel silicide (e.g., $Ni_3Si$, $Ni_{31}Si_{12}$, $Ni_2Si$, $Ni_3Si_2$, NiSi, $NiSi_2$; collectively "Ni silicide"), copper silicide (e.g., $Cu_{17}Si_3$, $Cu_{56}Si_{11}$, $Cu_5Si$, $Cu_{33}Si_7$, $Cu_4Si$, $Cu_{19}Si_6$, $Cu_3Si$, $Cu_{87}Si_{13}$; collectively "Cu silicide"), tungsten silicide ($W_5Si_3$, $WSi_2$; collectively "W silicide"), and molybdenum silicide ($Mo_3Si$, $Mo_5Si_3$, $MoSi_2$; collectively "Mo silicide").

In some embodiments, the etching-back process of the silicidation process 127 includes a dry etching process, a wet etching process, or another applicable process. In some embodiments, the deposition process of the silicidation process 127 includes a physical vapor deposition (PVD) process, an atomic layer deposition (ALD) process, or another applicable process. In some embodiments, the annealing process is performed at a temperature in a range from about 300° C. to about 800° C. After performing the silicidation process 127, portions of the metal material that has not reacted with the first source/drain feature 124a and the second source/drain feature 124b are removed.

In some embodiments, a thickness of the silicide layers 128a and 128b is reduced to decrease an area of an overlap region between the silicide layers 128a and 128b and subsequent contact structures formed over the silicide layers 128a and 128b. In some embodiments, a thickness of the silicide layers 128a and 128b is in a range from about 30 Å to about 50 Å.

After the silicide layers 128a and 128b are formed, an etch stop layer (not shown) is formed over the silicide layers 128a and 128b, the first source/drain feature 124a and the second source/drain feature 124b, the hard mask patterns 110a, 110b and 110c, and the dummy gate structures 118a, 118b and 118c in accordance with some embodiments. The etch stop layer may be a single layer or multiple layers. In some embodiments, the etch stop layer is made of silicon carbide (SiC), silicon nitride (SixNy), silicon carbonitride (SiCN), silicon oxycarbide (SiOC), silicon oxycarbon nitride (SiOCN), tetraethoxysilane (TEOS) or another applicable material. In some embodiments, the etch stop layer is formed by performing a plasma enhanced chemical vapor deposition (CVD) process, a low pressure CVD process, an atomic layer deposition (ALD) process, or another applicable process.

Figure 1F:
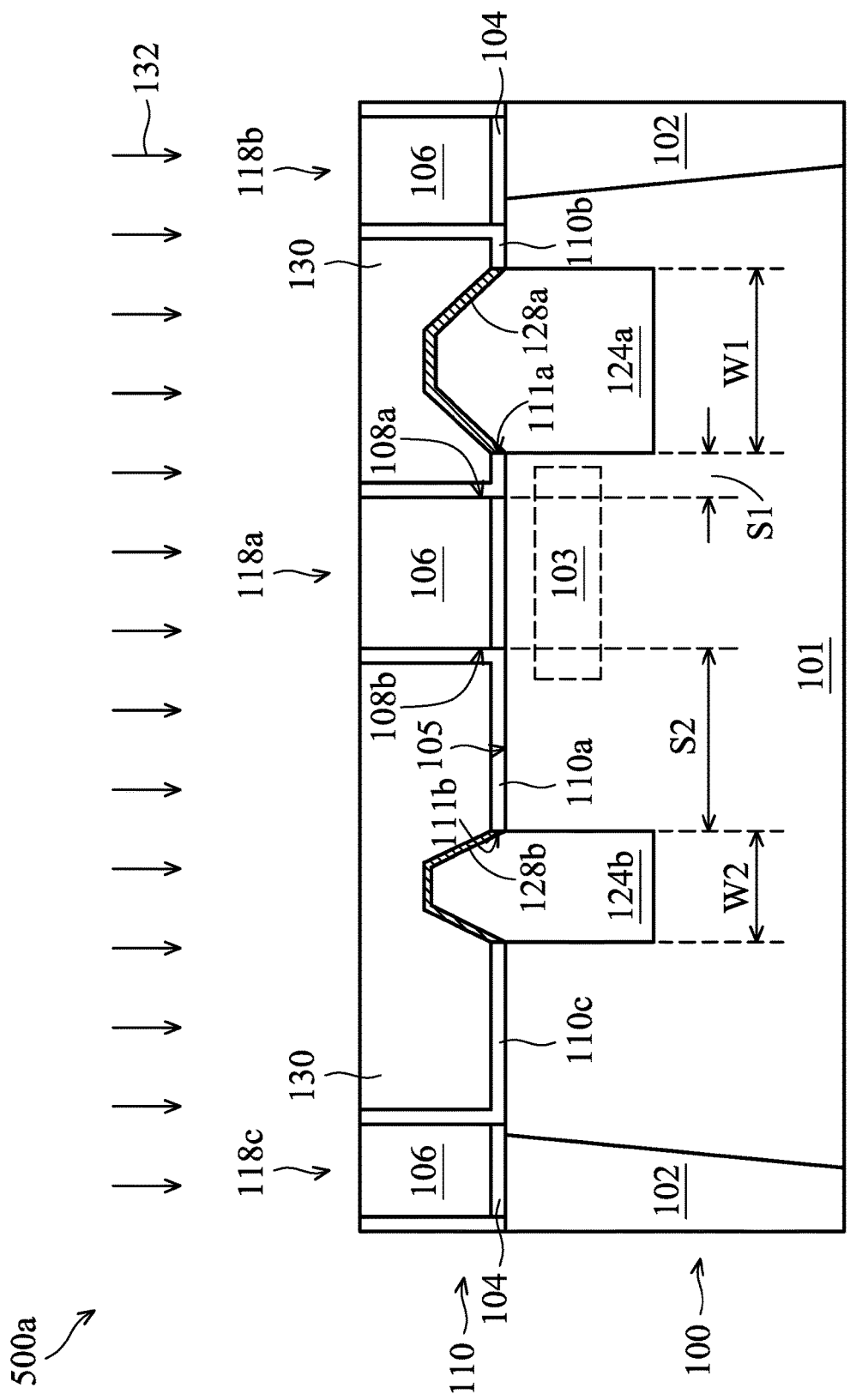

After the etch stop layer is formed, an inter-layer dielectric (ILD) structure 130 is formed over the silicide layers 128a and 128b, the first source/drain feature 124a and the second source/drain feature 124b, the hard mask patterns 110a, 110b and 110c, and the dummy gate structures 118a, 118b and 118c, as shown in FIG. 1F in accordance with some embodiments. The ILD structure 130 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 130 may be formed by chemical vapor deposition (CVD), physical vapor deposition, (PVD), atomic layer deposition (ALD), spin-on coating, or other applicable processes.

After the ILD structure 130 is formed, a planarization process 132 is performed on the ILD structure 130 to thin down the ILD structure 130, as shown in FIG. 1F in accordance with some embodiments. The planarization process 132 is performed to remove the ILD structure 130 and the hard mask patterns 110a, 110b and 110c above the dummy gate structures 118a, 118b and 118c. In some embodiments, the planarization process 132 is performed until the dummy gate structures 118a, 118b and 118c are exposed. The planarization process 132 may include a CMP process, a grinding process, an etching process, another applicable process, or a combination thereof. After performing the planarization process, the hard mask patterns 110a, 110b and 110c may form as L-shaped spacers.

Figure 1G:
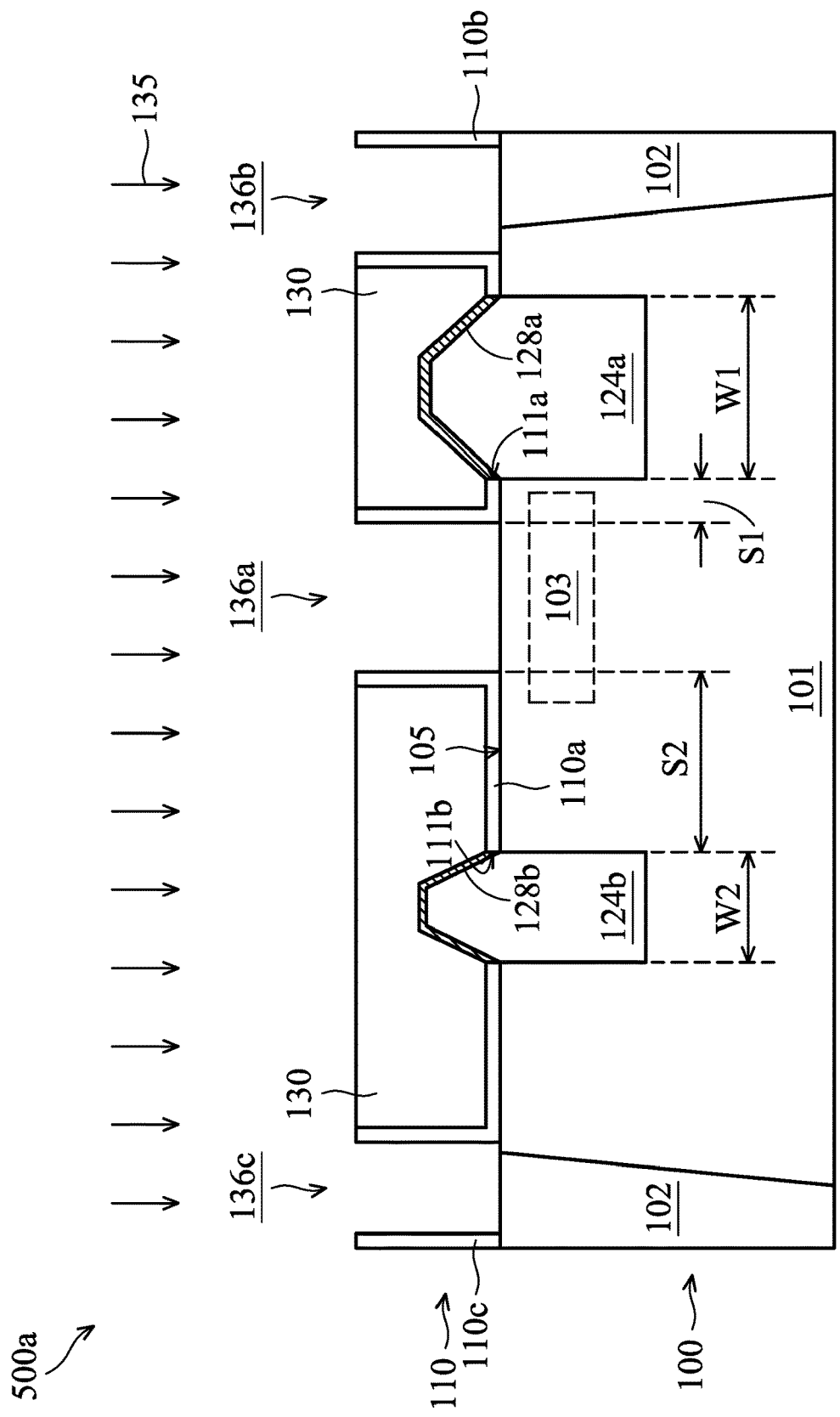

After the ILD structure 130 is formed, a removal process 135 is performed to form trenches 136a, 136b and 136c in the ILD structure 130, as shown in FIG. 1G in accordance with some embodiments. The removal process 135 is performed to remove the exposed dummy gate structures 118a, 118b and 118c each including the gate electrode 106 and the gate dielectric 104 below the gate electrode 106 (shown in FIG. 1F). As a result, trenches 136a, 136b and 136c are formed over the semiconductor fin structure 100. In some embodiments, a trench 136a is formed between the first source/drain feature 124a and the second source/drain feature 124b and exposes a portion of the semiconductor fin structure 100 that was previously covered by the dummy gate structure 118a. In addition, the trench 136b may be formed close to the first source/drain feature 124a and exposes a portion of the semiconductor fin structure 100 that is previously covered by the dummy gate structure 118b. Furthermore, the trench 136c may be formed close to the second source/drain feature 124b and exposes a portion of the semiconductor fin structure 100 that is previously covered by the dummy gate structure 118c. In some embodiments, the removal process 135 includes a wet etching process, a dry etching process, another applicable process, or a combination thereof.

Figure 1H:
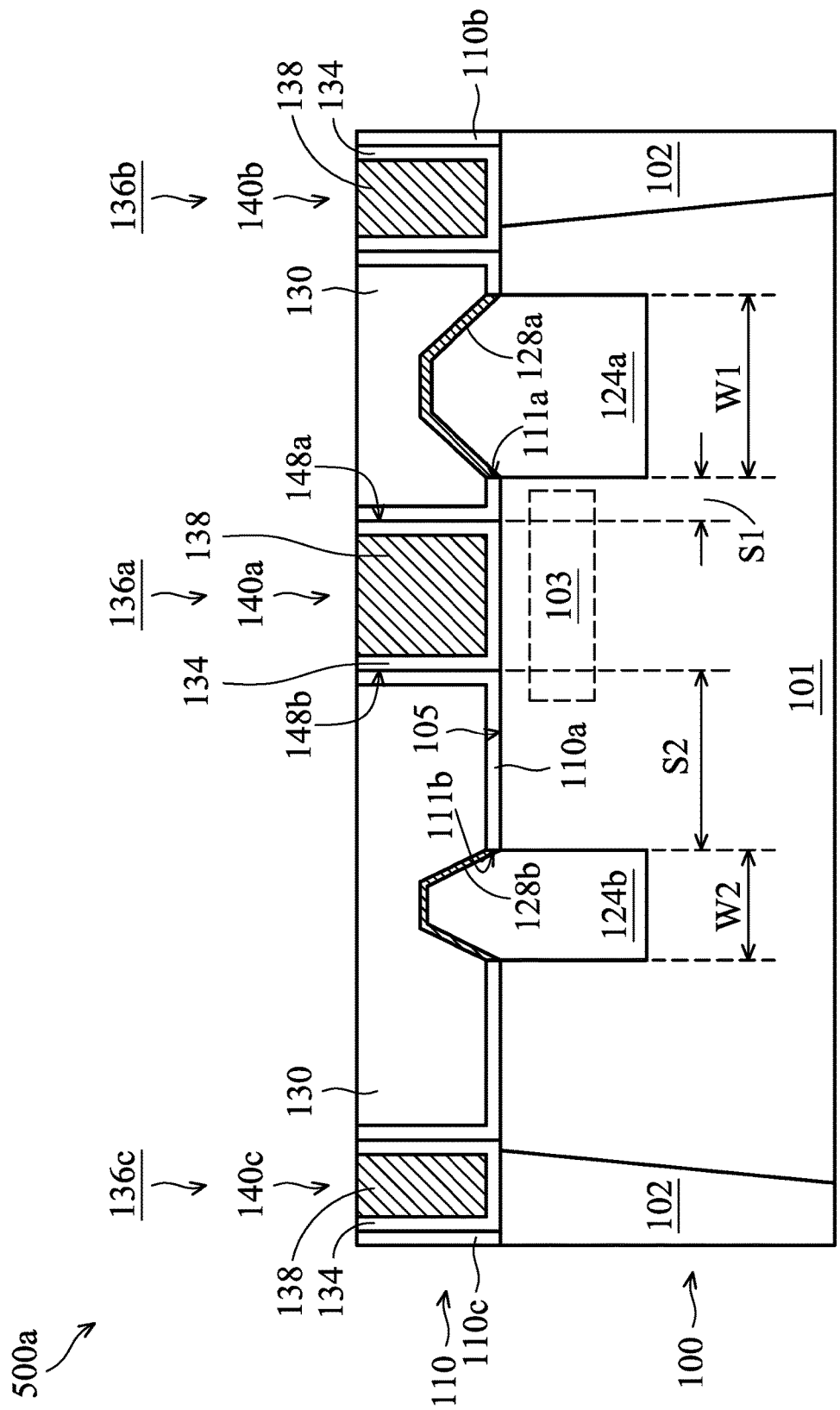

After the trenches 136a, 136b and 136c are formed, a gate structure 140a, a first edge structure 140b and a second edge structure 140c are respectively formed in the trenches 136a, 136b and 136c, as shown in FIG. 1H in accordance with some embodiments. In some embodiments, the gate structure 140a, the first edge structure 140b and the second edge structure 140c are formed over the semiconductor fin structure 100. In addition, the gate structure 140 may be surrounded by the hard mask pattern 110a, the first edge structure 140b may be surrounded by the hard mask pattern 110b, and may be surrounded by the hard mask pattern 110 may be surrounded by the hard mask pattern 110c.

In some embodiments, the gate structure 140a may be formed between the first edge structure 140b and the second edge structure 140c. In some embodiments, the gate structure 140a has a first side 148a and a second side 148b opposite to the first side 148a. In addition, the first source/drain feature 124a and the second source/drain feature 124b are respectively formed on the first side 148a and the second side 148b of the gate structure 140a. In some embodiments, the gate structure 140a is shifted off a central portion 152 of the semiconductor fin structure 100 between the first source/drain feature 124a and the second source/drain feature 124b. In some embodiments, the first source/drain feature 124a is separated from the first side 148a of the gate structure 140a by the first distance S1, and the second source/drain feature 124b is separated from the second side 148b of the gate structure 140a by the second distance S2 that is different from the first distance S1. In some embodiments, when the first source/drain feature 124a is a source feature and the second source/drain feature 124b is a drain feature in a transistor, the first distance S1 is less than the second distance S2.

In some embodiments, the gate structure 140a is completely formed on the semiconductor fin structure 100 and between the first edge structure 140b and the second edge structure 140c. The first edge structure 140b and the second edge structure 140c may be partially on the semiconductor fin structure 100 and partially on the isolating features 102. In some embodiments, the first edge structure 140b and the second edge structure 140c are not configured to be gate terminals of transistors, but are configured to protect edges of the semiconductor device 500a. In some other embodiments, more than one gate structures 130 are formed between the first edge structure 140b and the second edge structure 140c.

In some embodiments, each of the gate structure 140a, the first edge structure 140b and the second edge structure 140c includes a gate dielectric layer 134 and a gate electrode layer 138 over the gate dielectric layer 134. The gate dielectric layer 134 may conformally form over sidewalls and a bottom of each of the trenches 136a, 136b and 136c. In addition, the gate electrode layer 138 may be formed over the gate dielectric layer 134 and filling each of the trenches 136a, 136b and 136c.

In some embodiments, the gate dielectric layer 134 of each of the gate structure 140a, the first edge structure 140b and the second edge structure 140c includes a single layer or multiple layers. In some embodiments, the gate dielectric layer 134 has a U-shape or a rectangular shape. In some embodiments, the gate dielectric layer 134 is formed of a high-k dielectric layer. The high-k dielectric layer may be made of hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate dielectric layer 134 is made of a dielectric material with a dielectric constant in a range from about 12 to about 50.

In some embodiments, the gate dielectric layer 134 of each of the gate structure 140a, the first edge structure 140b and the second edge structure 140c is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). In some embodiments, a high-temperature annealing operation is performed to reduce or eliminate defects in the gate dielectric layer 134.

In some other embodiments, before the gate dielectric layer 134 is formed, an interfacial layer (not shown) is formed in the trenches 136a, 136b and 136c. The interfacial layer may be used to reduce stress between the gate dielectric layer 134 and the semiconductor fin structure 100. In some embodiments, the interfacial layer is made of silicon oxide. In some embodiments, the interfacial layer is formed by a deposition process, such as an ALD process, a thermal oxidation process, another applicable process, or a combination thereof.

In some embodiments, the gate electrode layer 138 of each of the gate structure 140a, the first edge structure 140b and the second edge structure 140c are made of a conductive material, such as aluminum (Al), copper (Cu), tungsten (W), titanium (Ti), tantalum (Ta), or another applicable material. In some embodiments, the gate electrode layer 138 of each of the gate structure 140a, the first edge structure 140b and the second edge structure 140c are formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some embodiments, a work function layer (not shown) may be formed between the gate dielectric layer 134 and the gate electrode layer 138 of each of the gate structure 140a, the first edge structure 140b and the second edge structure 140c. The work function layer (not shown) is made of metal material, and the metal material may include N-work-function metal or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal may include titanium nitride (TiN), tungsten nitride (WN), tantalum nitride (TaN), ruthenium (Ru) or a combination thereof.

Figure 1I:
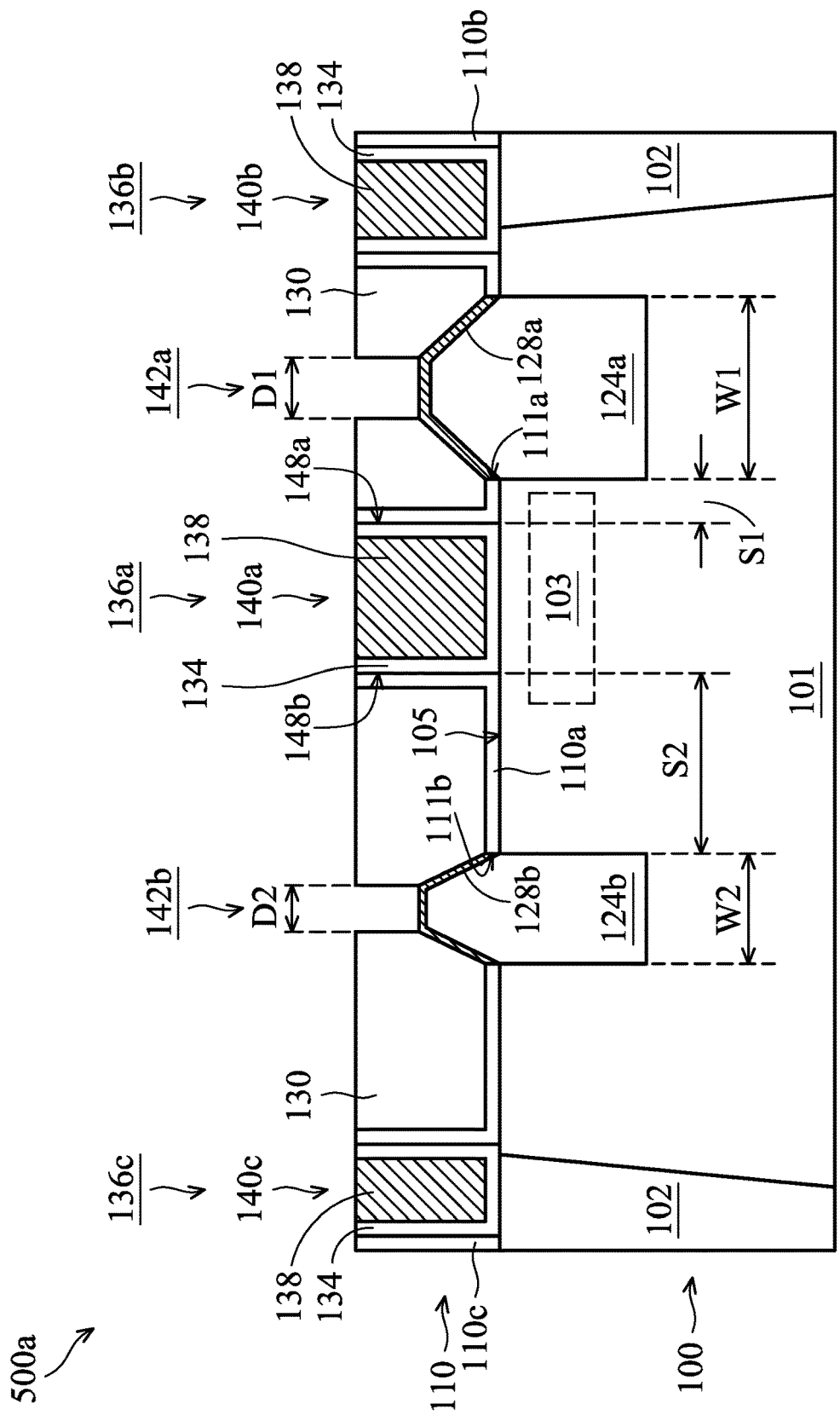

After the gate structure 140a, the first edge structure 140b and the second edge structure 140c are formed, a first hole 142a and a second hole 142b are formed through the ILD structure 130, as shown in FIG. 1I in accordance with some embodiments. In some embodiments, the first hole 142a and the second hole 142b are respectively formed over the first source/drain feature 124a and the second source/drain feature 124b. In addition, the first source/drain feature 124a may be exposed to the first hole 142a, and the second source/drain feature 124b may be exposed to the second hole 142b. In some embodiments, the first hole 142a has a first diameter D1, and the second hole 142b has a second diameter D2 that is different from or equal to the first diameter D1. In some embodiments, when the first source/drain feature 124a is a source feature and the second source/drain feature 124b is a drain feature in a transistor, the first diameter D1 of the first hole 142a is greater than the second diameter D2 of the second hole 142b. In some embodiments, the first hole 142a and the second hole 142b are formed by a patterning process. In some embodiments, the patterning process includes a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Figure 1J:
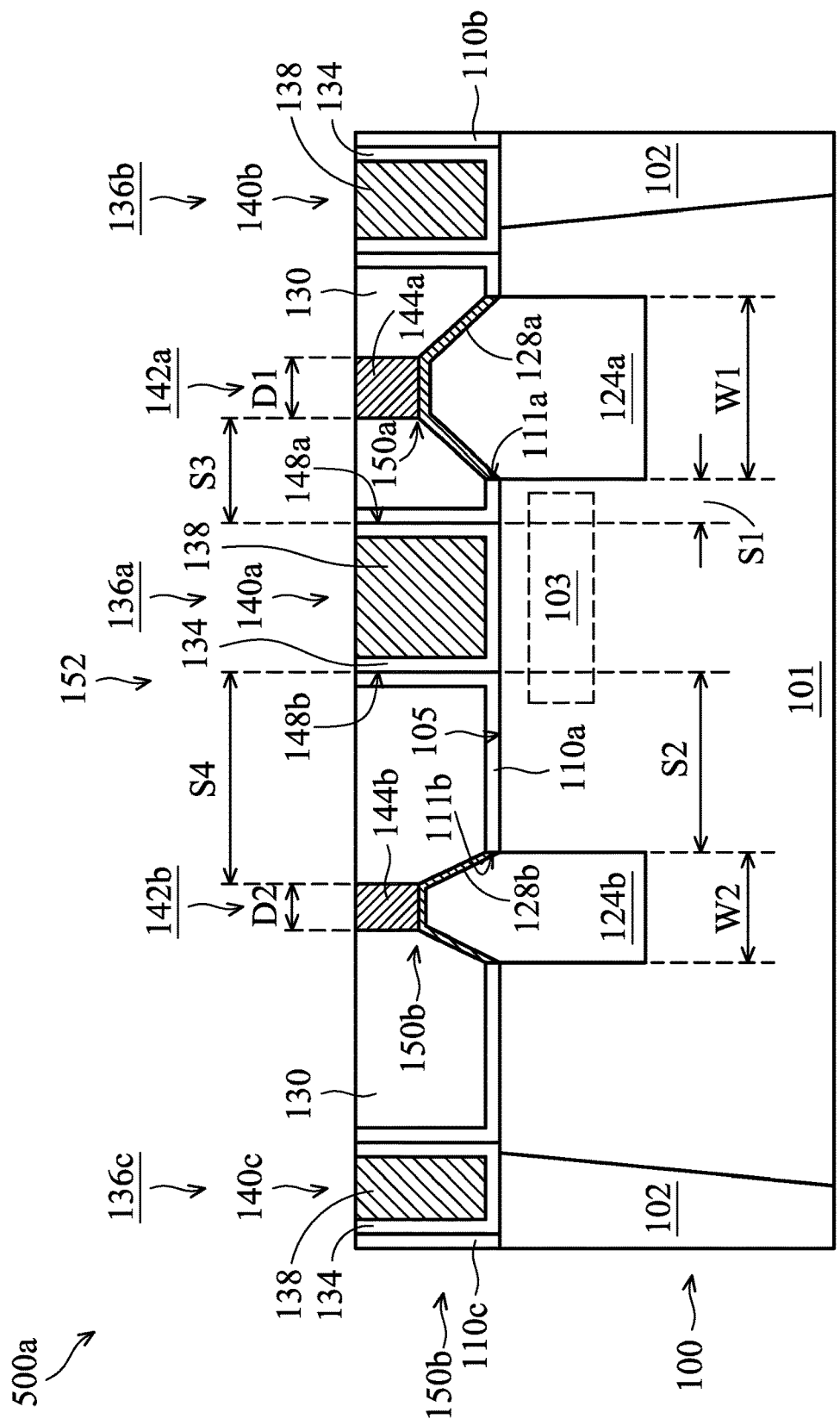

After the first hole 142a and the second hole 142b are formed, a first contact structure 144a and a second contact structure 144b are respectively formed filling the first hole 142a and the second hole 142b, as shown in FIG. 1J in accordance with some embodiments. In some embodiments, the first contact structure 144a and the second contact structure 144b are formed by a deposition process and a subsequent planarization process. The deposition process may be performed to entirely form a conductive material (not shown) over the ILD structure 130 and filling the first hole 142a and the second hole 142b. Afterwards, the planarization process may be performed to remove the conductive material above the dielectric layer structure 113 and outside the first hole 142a and the second hole 142b. The planarization process may be performed until the ILD structure 130 is exposed. After performing the planarization process, the first contact structure 144a and the second contact structure 144b are respectively formed in the first hole 142a and the second hole 142b. In some embodiments, the first contact structure 144a has the first diameter D1 and is electrically connected to the first source/drain feature 124a. In addition, the second contact structure 144b may have a second diameter D2 and is electrically connected to the second source/drain feature 124b. In some embodiments, when the first source/drain feature 124a is a source feature and the second source/drain feature 124b is a drain feature, the first diameter D1 of the first contact structure 144a is greater than the second diameter D2 of the second contact structure 144b.

In some embodiments, the first contact structure 144a is spaced apart from the first side 148a of the gate structure 140a by a third distance S3, and the second contact structure 144b is spaced apart from the second side 148b of the gate structure 140a by a fourth distance S4 that is different from the third distance S3. In some embodiments, when the first source/drain feature 124a is a source feature and the second source/drain feature 124b is a drain feature, the third distance S3 between the first contact structure 144a and the gate structure 140a is less than the fourth distance S4 between the second contact structure 144b and the gate structure 140a.

In some embodiments, the first contact structure 144a and the second contact structure 144b are made of a conductive material, such as copper (Cu), aluminum (Al), tungsten (W), titanium (Ti), titanium nitride (TiN), tantalum (Ta), tantalum nitride (TaN), or another applicable material. In some embodiments, the deposition process includes a physical vapor deposition (PVD) process, an atomic layer deposition (ALD) process, or another applicable process. In some embodiments, the deposition process includes a plating method. In some embodiments, the planarization process includes an etch-back process and/or a chemical mechanical polishing (CMP) process.

Figure 2A:
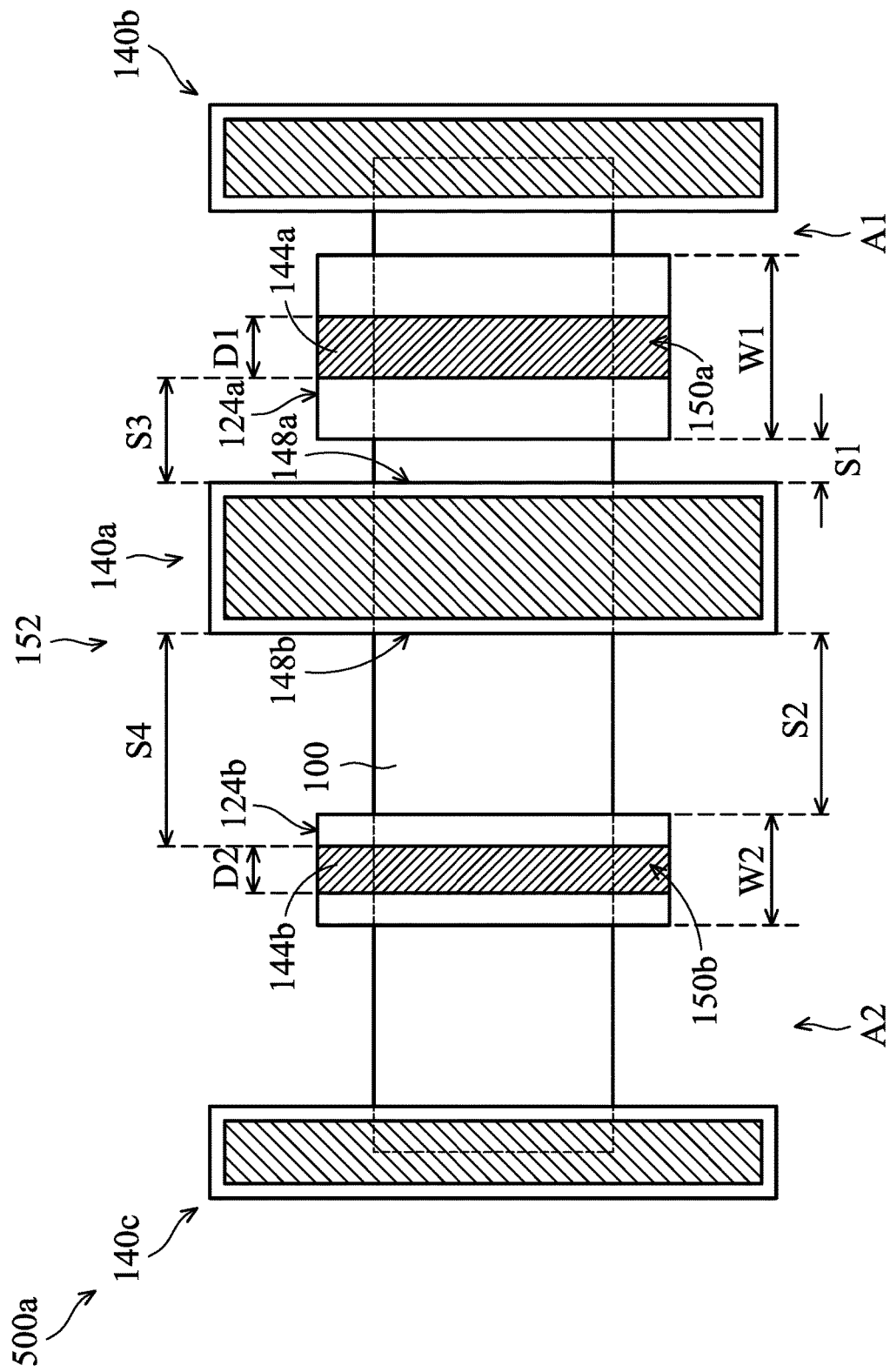
FIG. 2A is a plane view of a semiconductor device, in accordance with some embodiments.

After performing the aforementioned processes, a semiconductor device 500a is formed, as shown in FIG. 1J in accordance with some embodiments. FIG. 2A is a plane view of the semiconductor device 500a as shown in FIG. 1J, in accordance with some embodiments. For clearly showing the arrangement of the gate structure 140a, the first edge structure 140b and the second edge structure 140c, the first source/drain feature 124a and the second source/drain feature 124b, and the first contact structure 144a and the second contact structure 144b of the semiconductor device 500a, the isolating features 102, the buried channel region 103, the hard mask patterns 110a, 110b and 110c and the ILD structure 130 of the semiconductor device 500a are not shown in FIG. 2A.

As shown in FIG. 1J and FIG. 2A, in some embodiments, the semiconductor device 500a includes the semiconductor fin structure 100, the gate structure 140a, the first edge structure 140b, the second edge structure 140c, the first source/drain feature 124a, the second source/drain feature 124b, the first contact structure 144a and the second contact structure 144b. In some embodiments, the gate structure 140a, the first edge structure 140b and the second edge structure 140c are formed over the semiconductor fin structure 100. In addition, the first source/drain feature 124a is formed between the gate structure 140a and the first edge structure 140b. The second source/drain feature 124b is formed between the gate structure 140a and the edge structure 140c. In some embodiments, the first contact structure 144a is formed over and electrically connected to the first source/drain feature 124a. In addition, the second contact structure 144b is formed over and electrically connected to the second source/drain feature 124b.

In some embodiments, the first source/drain feature 124a has a first geometric condition, and the second source/drain feature 124b has a second geometric condition that is different from the first geometric condition. For example, the first geometric condition includes the first distance S1 between the first source/drain feature 124a and the gate structure 140a, the second geometric condition includes the second distance S2 between the second source/drain feature 124b and the gate structure 140a.

In some embodiments, when the first source/drain feature 124a is a source feature and the second source/drain feature 124b is a drain feature of the semiconductor device 500a, the first distance S1 between the first source/drain feature 124a and the gate structure 140a is less than the second distance S2 between the second source/drain feature 124b and the gate structure 140a. Because the distance between the drain feature and the gate structure (e.g. the second distance S2) is longer than the distance between the source feature and the gate structure (e.g. the first distance S1), the gate-to-drain capacitance (Cf) of the semiconductor device 500a will be reduced.

In some embodiments, a ratio of the second distance S2 to the first distance S1 ranges from about 1.5 to about 4.5. If the ratio is too large, the semiconductor device 500a will occupy more area and the size of the semiconductor device 500a is increased, in some instances. If the ratio is too small, then the functionality of the semiconductor device 500a will fail, in some instances. In some embodiments, the first distance S1 is slightly longer than the minimum spacing rule. In some embodiments, the semiconductor device 500a operates at a cutoff frequency higher than 350 GHz.

In some embodiments, the first geometric condition includes the first width W1 of the first source/drain feature 124a, and the second geometric condition includes the second width W2 of the second source/drain feature 124b. In some embodiments, when the first source/drain feature 124a is a source feature and the second source/drain feature 124b is a drain feature of the semiconductor device 500a, the first width W1 of the first source/drain feature 124a is greater than the second width W2 of the second source/drain feature 124b. Because the first width W1 of the source feature (the first source/drain feature 124a) is greater than the second width W2 of the drain feature (the second source/drain feature 124b), the gate-to-drain capacitance (Cf) of the semiconductor device 500a will be reduced.

As shown in FIG. 1J and FIG. 2A, in some embodiments, the first contact structure 144a has a third geometric condition, the second contact structure 144b has a fourth geometric condition that is different from the third geometric condition. For example, the third geometric condition includes an area A1 of a first overlap region 150a between the first contact structure 144a and the first source/drain feature 124a, the fourth geometric condition includes an area A2 of a second overlap region 150b between the second contact structure 144b and the second source/drain feature 124b.

In some embodiments, the area A1 of the first overlap region 150a between the first source/drain feature 124a and the first contact structure 144a corresponds to the first diameter D1 of the first contact structure 144a formed over the silicide layers 128a. In addition, the area A2 of the overlap region 150b between the second source/drain feature 124b and the second contact structure 144b may correspond to the second diameter D2 of the second contact structure 144b formed over the silicide layers 128b.

In some embodiments, when the first source/drain feature 124a is a source feature and the second source/drain feature 124b is a drain feature of the semiconductor device 500a, the area A1 of the first overlap region 150a between the first source/drain feature 124a and the first contact structure 144a is greater than the area A2 of the overlap region 150*b* between the second source/drain feature 124*b* and the second contact structure 144*b*. Because the area A2 of the overlap region 150*b* between the drain feature (the second source/drain feature 124*b*) and the drain contact structure (the second contact structure 144*b*) is less than the area A1 of the first overlap region 150*a* between the source feature (the first source/drain feature 124*a*) and the source contact structure (the first contact structure 144*a*), the gate-to-contact capacitance (Cco) at the drain side of the semiconductor device 500*a* will be reduced.

In some embodiments, the third geometric condition includes the first diameter D1 of the first contact structure 144*a*, and the fourth geometric condition includes the second diameter D2 of the second contact structure 144*b*. In some embodiments, when the first source/drain feature 124*a* is a source feature and the second source/drain feature 124*b* is a drain feature of the semiconductor device 500*a*, the first diameter D1 of the first contact structure 144*a* is greater than the second diameter D2 of the second contact structure 144*b*. Because the diameter of the drain contact structure (the second contact structure 144*b*) is less than the diameter of the source contact structure (the first contact structure 144*a*), the gate-to-contact capacitance (Cco) at the drain side of the semiconductor device 500*a* will be reduced.

In some embodiments, the third geometric condition includes the third distance S3 between the first contact structure 144*a* and the gate structure 140*a*, and the fourth geometric condition includes fourth distance S4 between the second contact structure 144*b* and the gate structure 140*a*. In some embodiments, when the first source/drain feature 124*a* is a source feature and the second source/drain feature 124*b* is a drain feature of the semiconductor device 500*a*, the third distance S3 between the first contact structure 144*a* and the gate structure 140*a* is less than the fourth distance S4 between the second contact structure 144*b* and the gate structure 140*a*. Because the distance between the drain contact structure (the second contact structure 144*b*) and the gate structure is longer than the distance between the source contact structure (the first contact structure 144*a*) and the gate structure, the gate-to-contact capacitance (Cco) at the drain side of the semiconductor device 500*a* will be reduced.

In some embodiments, the source feature and the drain feature of the semiconductor device 500*a* are arranged asymmetrically. In addition, the source contact structure and the drain contact structure of the semiconductor device 500*a* may be arranged asymmetrically. Therefore, the parasitic capacitances, such as gate-to-contact capacitance (Cco) and gate-to-source/drain fringe capacitance (Cf), of the semiconductor device 500*a* will be reduced. In addition, a speed of the semiconductor device 500*a* will be enhanced.

Figure 2B:
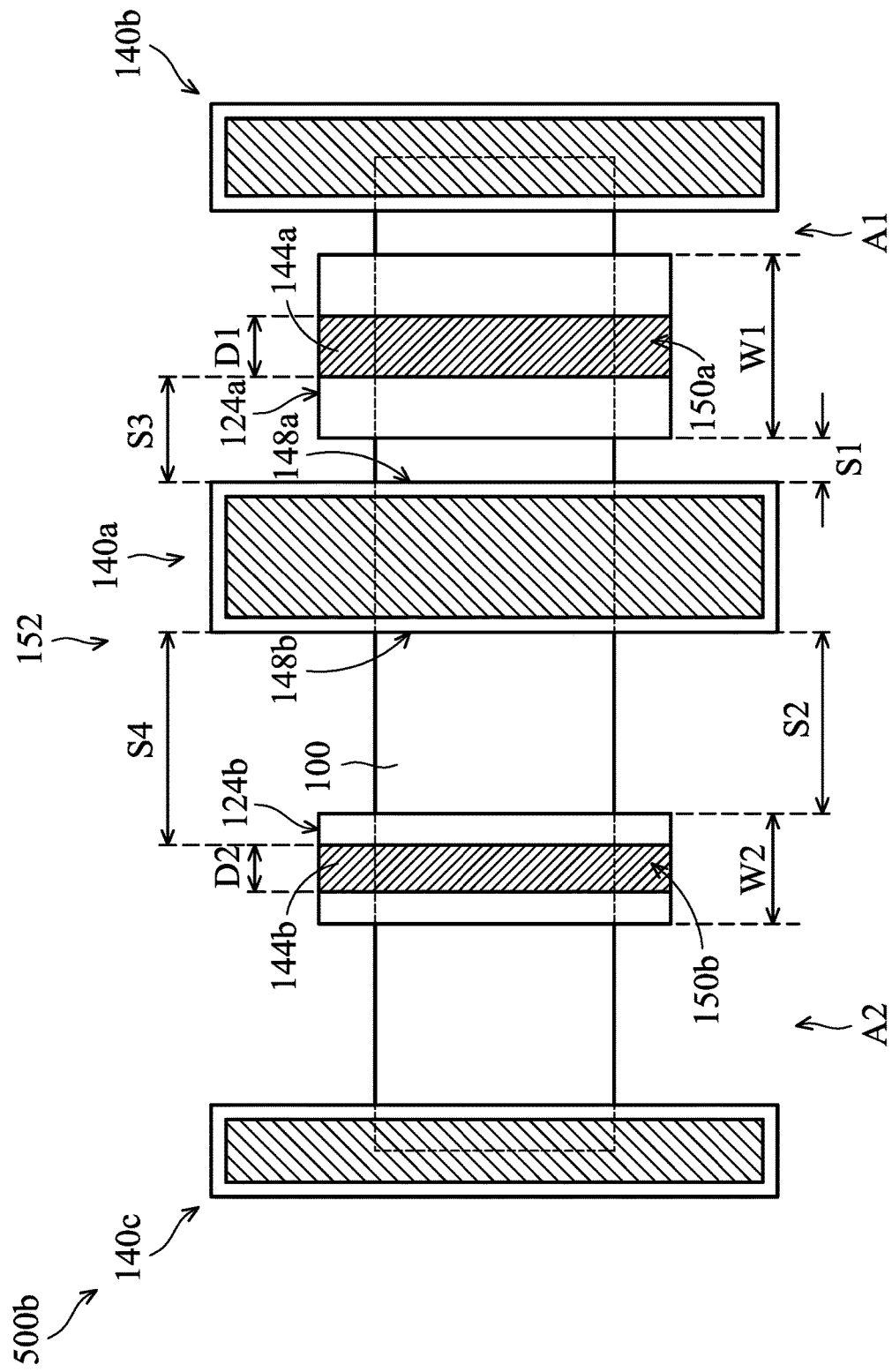
FIG. 2B is a plane view of a semiconductor device, in accordance with some embodiments.

FIG. 2B is a plane view of a semiconductor device 500*b*, in accordance with some embodiments. The materials, configurations, structures and/or processes of the semiconductor device 500*b* may be similar to, or the same as, those of the semiconductor device 500*a*, and the details thereof are not repeated herein.

As shown in FIG. 2B, in some embodiments, when the first source/drain feature 124*a* is a source feature and the second source/drain feature 124*b* is a drain feature of the semiconductor device 500*b*, the first distance S1 between the first source/drain feature 124*a* (the source feature) and the gate structure 140*a* is less than the second distance S2 between the second source/drain feature 124*b* (the drain feature) and the gate structure 140*a*. In some embodiments, the first width W1 of the first source/drain feature 124*a* (the source feature) is equal to the second width W2 of the second source/drain feature 124*b* (the drain feature). In some embodiments, the area A1 of the first overlap region 150*a* between the first source/drain feature 124*a* (the source feature) and the first contact structure 144*a* (the source contact structure) is greater than the area A2 of the overlap region 150*b* between the second source/drain feature 124*b* (the drain feature) and the second contact structure 144*b* (the drain contact structure). In addition, the first diameter D1 of the first contact structure 144*a* may be greater than the second diameter D2 of the second contact structure 144*b* (the drain contact structure). Furthermore, the third distance S3 between the first contact structure 144*a* (the source contact structure) and the gate structure 140*a* is less than the fourth distance S4 between the second contact structure 144*b* (the drain contact structure) and the gate structure 140*a*.

In some embodiments, the source feature and the drain feature of the semiconductor device 500*b* are arranged asymmetrically. In addition, the source contact structure and the drain contact structure of the semiconductor device 500*b* may be arranged asymmetrically. Therefore, the parasitic capacitances, such as gate-to-contact capacitance (Cco) and gate-to-source/drain fringe capacitance (Cf), of the semiconductor device 500*b* will be reduced.

Figure 2C:
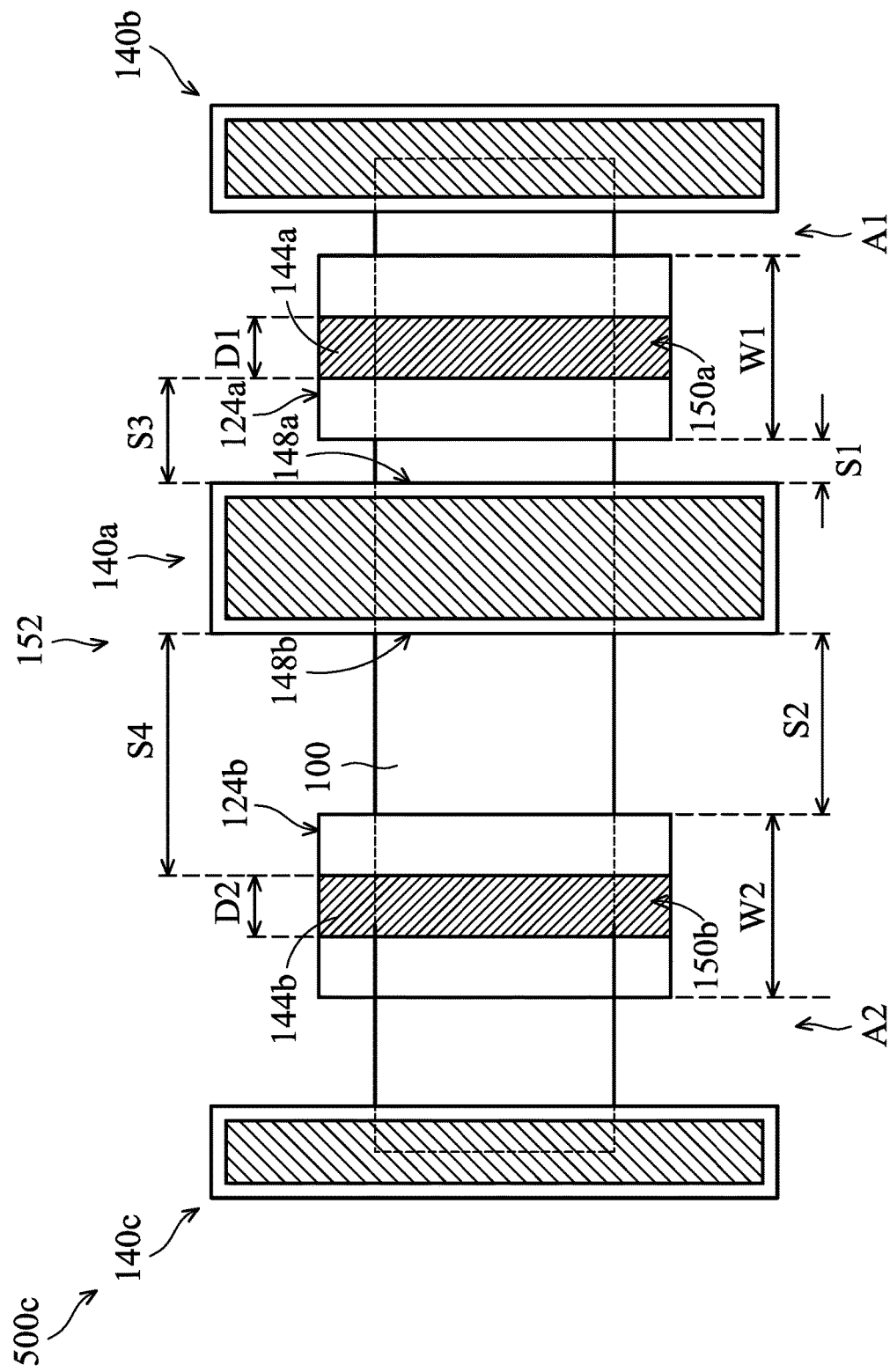
FIG. 2C is a plane view of a semiconductor device, in accordance with some embodiments.

FIG. 2C is a plane view of a semiconductor device 500*c*, in accordance with some embodiments. The materials, configurations, structures and/or processes of the semiconductor device 500*c* may be similar to, or the same as, those of the semiconductor device 500*a*, and the details thereof are not repeated herein.

As shown in FIG. 2C, in some embodiments, when the first source/drain feature 124*a* is a source feature and the second source/drain feature 124*b* is a drain feature of the semiconductor device 500*c*, the first distance S1 between the first source/drain feature 124*a* (the source feature) and the gate structure 140*a* is less than the second distance S2 between the second source/drain feature 124*b* (the drain feature) and the gate structure 140*a*. In some embodiments, the first width W1 of the first source/drain feature 124*a* (the source feature) is equal to the second width W2 of the second source/drain feature 124*b* (the drain feature). In some embodiments, the area A1 of the first overlap region 150*a* between the first source/drain feature 124*a* (the source feature) and the first contact structure 144*a* (the source contact structure) is equal to the area A2 of the overlap region 150*b* between the second source/drain feature 124*b* (the drain feature) and the second contact structure 144*b* (the drain contact structure). In addition, the first diameter D1 of the first contact structure 144*a* may be equal to the second diameter D2 of the second contact structure 144*b* (the drain contact structure). Furthermore, the third distance S3 between the first contact structure 144*a* (the source contact structure) and the gate structure 140*a* is less than the fourth distance S4 between the second contact structure 144*b* (the drain contact structure) and the gate structure 140*a*.

In some embodiments, the source feature and the drain feature of the semiconductor device 500*c* are arranged asymmetrically. In addition, the source contact structure and the drain contact structure of the semiconductor device 500*c* may be arranged asymmetrically. Therefore, the parasitic capacitances, such as gate-to-contact capacitance (Cco) and gate-to-source/drain fringe capacitance (Cf), of the semiconductor device 500*c* will be reduced.

Embodiments for a semiconductor device (e.g. the semiconductor devices 500*a*, 500*b* and 500*c*) and a method for forming the same are provided. The method for forming a semiconductor device includes forming a gate structure (e.g.

the dummy gate structure 118a and the gate structure 140a) over a fin structure (e.g. the semiconductor fin structure 100). The method includes forming a hard mask layer (e.g. the hard mask layer 110) over the gate structure and extending to the fin structure. The hard mask layer has a first opening (e.g. the opening 119a) spaced apart from a first side (e.g. the first side 108a of the dummy gate structure 118a and the first side 148a of the gate structure 140a) of the gate structure by a first distance (e.g. the first distance S1) and a second opening (e.g. the opening 119b) spaced apart from a second side (e.g. the second side 108b of the dummy gate structure 118a and the second side 148b of the gate structure 140a) of the gate structure by a second distance (e.g. the second distance S2) that is different from the first distance. The method also includes removing the fin structure not covered by the hard mask layer. The method further includes forming a first source/drain feature (e.g. the first source/drain feature 124a) in the fin structure and filling the first opening of the hard mask layer. The method further includes forming a second source/drain feature (e.g. the second source/drain feature 124b) in the fin structure and filling the second opening of the hard mask layer. In some embodiments, because the first distance (e.g. the first distance S1) between the first source/drain feature and the gate structure is different from the second distance (e.g. the second distance S2) between the second source/drain feature and the gate structure, the parasitic capacitances, such as gate-to-contact capacitance (Cco) and gate-to-source/drain fringe capacitance (Cf), of the semiconductor device will be reduced and the speed of the semiconductor device will be enhanced.

Embodiments of a semiconductor device and a method for forming the same are provided. The method includes forming a gate structure over a fin structure. The method includes forming a hard mask layer over the gate structure. The hard mask layer has a first opening spaced apart from the gate structure by a first distance and a second opening spaced apart from the gate structure by a second distance. A first source/drain feature is formed in the fin structure and filling the first opening of the hard mask layer. A second source/drain feature is formed in the fin structure and filling the second opening of the hard mask layer. In some embodiments, by extending the distance between the gate structure and at least one of the source/drain features, the parasitic capacitances of the semiconductor device will be reduced and a speed of the semiconductor device will be enhanced.

In some embodiments, a method for forming a semiconductor device is provided. The method includes forming a gate structure over a fin structure. The method includes forming a hard mask layer over the gate structure. The hard mask layer has a first opening spaced apart from a first side of the gate structure by a first distance and a second opening spaced apart from a second side of the gate structure by a second distance that is different from the first distance. The method also includes removing the fin structure not covered by the hard mask layer. The method further includes forming a first source/drain feature in the fin structure and filling the first opening of the hard mask layer. The method further includes forming a second source/drain feature in the fin structure and filling the second opening of the hard mask layer.

In some embodiments, a method for forming a semiconductor device is provided. The method includes forming a gate structure over a fin structure. The method also includes forming a first source/drain feature and a second source/drain feature in the fin structure and on opposite sides of the gate structure. The gate structure is shifted off a central portion of the fin structure between the first source/drain feature and the second source/drain feature. The method further includes forming a first contact structure with a first diameter to electrically connect to the first source/drain feature. The method further includes forming a second contact structure with a second diameter to electrically connect to the second source/drain feature. The first diameter of the first contact structure is different from the second diameter of the second contact structure.

In some embodiments, a semiconductor device is provided. The semiconductor device includes a gate structure over a fin structure. A first source/drain feature and a second source/drain feature are formed in the fin structure and on opposite sides of the gate structure. The first source/drain feature has a first geometric condition. The second source/drain feature has a second geometric condition that is different from the first geometric condition. A first contact structure is electrically connected to the first source/drain feature. A second contact structure is electrically connected to the second source/drain feature. The first contact structure has a third geometric condition. The second contact structure has a fourth geometric condition that is different from the third geometric condition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    forming a gate structure over a fin structure;
    forming a hard mask layer over the gate structure and extending to the fin structure, wherein the hard mask layer has a first opening spaced apart from a first side of the gate structure by a first distance and a second opening spaced apart from a second side of the gate structure by a second distance that is different from the first distance;
    removing the fin structure exposed by the first opening and the second opening of the hard mask layer;
    forming a first source/drain feature in the fin structure and filling the first opening of the hard mask layer;
    forming a second source/drain feature in the fin structure and filling the second opening of the hard mask layer;
    forming a first contact structure with a first diameter over the first source/drain feature; and
    forming a second contact structure with a second diameter over the second source/drain feature, wherein the first diameter of the first contact structure is different from the second diameter of the second contact structure.

2. The method for forming a semiconductor device, as claimed in claim 1, wherein removing the fin structure comprises:
    removing a first portion of the fin structure exposed to the first opening of the hard mask layer to form a first recess; and removing a second portion of the fin structure exposed to the second opening of the hard mask layer to form a second recess.

3. The method for forming a semiconductor device, as claimed in claim 1, wherein the first source/drain feature is a source feature and the second source/drain feature is a drain feature, and the first distance is shorter than the second distance.

4. The method for forming a semiconductor device, as claimed in claim 1, wherein the first opening of the hard mask layer has a first width, and the second opening of the hard mask layer has a second width that is different from the first width.

5. The method for forming a semiconductor device, as claimed in claim 4, wherein the first source/drain feature is a source feature and the second source/drain feature is a drain feature, and the first width is greater than the second width.

6. The method for forming a semiconductor device, as claimed in claim 1, further comprising:
forming a dielectric layer over the fin structure, the gate structure, the first source/drain feature and the second source/drain feature before forming the first contact structure and the second contact structure, wherein the first contact structure and the second contact structure are formed in the dielectric layer.

7. The method for forming a semiconductor device, as claimed in claim 6, wherein the first source/drain feature is a source feature and the second source/drain feature is a drain feature, and the first diameter of the first contact structure is greater than the second diameter of the second contact structure.

8. A method for forming a semiconductor device, comprising:
forming a gate structure over a fin structure;
forming a first source/drain feature and a second source/drain feature in the fin structure and on opposite sides of the gate structure, wherein the gate structure is shifted off a central portion of the fin structure between the first source/drain feature and the second source/drain feature;
forming a first contact structure with a first diameter to electrically connect to the first source/drain feature; and
forming a second contact structure with a second diameter to electrically connect to the second source/drain feature, wherein the first diameter of the first contact structure is different from the second diameter of the second contact structure.

9. The method for forming a semiconductor device, as claimed in claim 8, wherein the first source/drain feature is a source feature and the second source/drain feature is a drain feature, and the first diameter of the first contact structure is greater than the second diameter of the second contact structure.

10. The method for forming a semiconductor device, as claimed in claim 8, further comprising:
forming a dielectric layer over the fin structure, the gate structure, the first source/drain feature and the second source/drain feature before forming the first contact structure and the second contact structure;
forming a first hole with the first diameter through the dielectric layer and over the first source/drain feature; and
forming a second hole with the second diameter through the dielectric layer and over the second source/drain feature, wherein the first contact structure is formed in the first hole, and the second contact structure is formed in the second hole.

11. The method for forming a semiconductor device, as claimed in claim 10, wherein the first source/drain feature is exposed to the first hole, and the second source/drain feature is exposed to the second hole.

12. The method for forming a semiconductor device, as claimed in claim 9, wherein forming the first source/drain feature and the second source/drain feature comprises:
forming a hard mask pattern covering the gate structure and extending to a portion of the fin structure;
removing a first portion of the fin structure not covered by the hard mask pattern to form a first recess, wherein the first recess is separated from the gate structure by a first distance;
removing a second portion of the fin structure not covered by the hard mask pattern to form a second recess, wherein the second recess is separated from the gate structure by a second distance that is greater than the first distance;
epitaxially growing the first source/drain feature in the first recess; and
epitaxially growing the second source/drain feature in the second recess.

13. The method for forming a semiconductor device, as claimed in claim 12, wherein the first source/drain feature is a source feature and the second source/drain feature is a drain feature, a first width of the first source/drain feature is greater than a second width of the second source/drain feature.

14. The method for forming a semiconductor device, as claimed in claim 12, wherein the hard mask pattern has a first edge and a second edge respectively on opposite sides of the gate structure, wherein the first edge is spaced apart from the gate structure by a first distance, and the second edge is spaced apart from the gate structure by a second distance that is different from the first distance.

15. The method for forming a semiconductor device, as claimed in claim 14, wherein forming the hard mask pattern comprises:
conformally forming a hard mask layer over the fin structure and the gate structure; and
forming a mask pattern over the hard mask layer;
removing the hard mask layer not covered by the mask pattern.

16. A method for forming a semiconductor device, comprising:
providing a fin structure having a first source/drain feature and a second source/drain feature;
forming an insulating layer over the fin structure, the first source/drain feature and the second source/drain feature;
forming a gate structure in the insulating layer, wherein the first source/drain feature is spaced apart from a first side of the gate structure by a first distance and the second source/drain feature is spaced apart from a second side of the gate structure by a second distance, wherein a ratio of the second distance to the first distance ranges from about 1.5 to about 4.5; and
forming a first contact structure and a second contact structure in the insulating layer and respectively over the first source/drain feature and the second source/drain feature,
wherein a first overlap region between the first contact structure and the first source/drain feature has a first area and a second overlap region between the second contact structure and the second source/drain feature has a second area, and wherein the first area is different from the second area.

17. The method for forming a semiconductor device as claimed in claim 16, wherein the first source/drain feature is a source feature and the second source/drain feature is a drain feature.

18. The method for forming a semiconductor device as claimed in claim 17, wherein the first area is greater than the second area.

19. The method for forming a semiconductor device as claimed in claim 16, further comprising:

forming a first edge structure in the insulating layer and on the first side of the gate structure, so that the first source/drain feature is between the gate structure and the first edge structure; and forming a second edge structure in the insulating layer and on the second side of the gate structure, so that the second source/drain feature is between the gate structure and the second edge structure, wherein each of the first edge structure and the second edge structure comprises a gate dielectric layer and a gate electrode layer over the gate dielectric layer.

20. The method for forming a semiconductor device as claimed in claim 16, wherein the first contact structure has a first diameter and the second contact structure has a second diameter that is different from the first diameter.

* * * * *